(12) United States Patent
Guo

(10) Patent No.: US 11,587,949 B1
(45) Date of Patent: Feb. 21, 2023

(54) METHOD OF MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Shuai Guo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/664,246

(22) Filed: May 20, 2022

Related U.S. Application Data

(63) Continuation of application No. PCT/CN2022/070279, filed on Jan. 5, 2022.

(30) Foreign Application Priority Data

Nov. 15, 2021 (CN) .......................... 202111346529.5

(51) Int. Cl.
| | | |
|---|---|---|
| *H01L 27/11512* | (2017.01) | |
| *H01L 27/11582* | (2017.01) | |
| *H01L 27/11556* | (2017.01) | |
| *H01L 27/11568* | (2017.01) | |
| *H01L 27/11521* | (2017.01) | |

(52) U.S. Cl.
CPC .. *H01L 27/11582* (2013.01); *H01L 27/11521* (2013.01); *H01L 27/11556* (2013.01); *H01L 27/11568* (2013.01)

(58) Field of Classification Search
CPC ......... H01L 27/11521; H01L 27/11556; H01L 27/11582; H01L 27/11586
See application file for complete search history.

(56) References Cited

U.S. PATENT DOCUMENTS

| | | |
|---|---|---|
| 8,482,049 B2 | 7/2013 | Son et al. |
| 9,472,551 B2 | 10/2016 | Oxland |
| 9,741,735 B2 | 8/2017 | Lee et al. |

(Continued)

FOREIGN PATENT DOCUMENTS

| | | |
|---|---|---|
| CN | 102122661 A | 7/2011 |
| CN | 105895635 A | 8/2016 |

(Continued)

OTHER PUBLICATIONS

International Search Report cited in PCT/CN2022/070279 dated Aug. 12, 2022, 16 pages.

*Primary Examiner* — Sarah K Salerno
(74) *Attorney, Agent, or Firm* — Cooper Legal Group, LLC

(57) ABSTRACT

A method of manufacturing a semiconductor structure and a semiconductor structure are provided. The method includes: providing a semiconductor substrate, and forming a first bit line; forming a support layer on the semiconductor substrate, the support layer including a first oxide layer, a first sacrificial layer, a second oxide layer, a second sacrificial layer, a third oxide layer, a third sacrificial layer and a fourth oxide layer that are stacked; forming, at a position corresponding to the first bit line, an active pillar penetrating through the support layer; removing each of the first sacrificial layer and the third sacrificial layer, and forming a first trench; removing a peripheral wall of the active pillar to form a first annular groove, a size of the first annular groove being greater than a size of the first trench in a vertical direction; forming a P-type filler in the first annular groove.

20 Claims, 17 Drawing Sheets

(56) References Cited

U.S. PATENT DOCUMENTS

| | | |
|---|---|---|
| 9,831,131 B1 | 11/2017 | Jacob |
| 10,998,316 B2 | 5/2021 | Lee |
| 11,329,046 B2 | 5/2022 | Choi |
| 2021/0296316 A1 | 9/2021 | Zhu |

FOREIGN PATENT DOCUMENTS

| | | |
|---|---|---|
| CN | 109449158 A | 3/2019 |
| CN | 112310079 A | 2/2021 |
| CN | 113078154 A | 7/2021 |
| CN | 113078156 A | 7/2021 |
| CN | 113130494 A | 7/2021 |
| KR | 20160095281 A | 8/2016 |

METHOD OF MANUFACTURING SEMICONDUCTOR STRUCTURE AND SEMICONDUCTOR STRUCTURE

CROSS-REFERENCE TO RELATED APPLICATIONS

This is a continuation of International Application No. PCT/CN2022/070279, filed on Jan. 5, 2022, which claims the priority to Chinese Patent Application No. 202111346529.5, titled "METHOD OF MANUFACTURING SEMICONDUCTOR STRUCTURE AND SEMICONDUCTOR STRUCTURE" and filed on Nov. 15, 2021. The entire contents of International Application No. PCT/CN2022/070279 and Chinese Patent Application No. 202111346529.5 are incorporated herein by reference.

TECHNICAL FIELD

The present disclosure relates to the technical field of semiconductors, and in particular to a method of manufacturing a semiconductor structure and a semiconductor structure.

BACKGROUND

With the development of semiconductor industry, there are increasingly smaller critical dimensions (CDs) of the semiconductor devices. In the related art, gate all around field effect transistors (GAAFETs) used in dynamic random access memories (DRAMs) can decrease line widths of the semiconductor devices to some extent, but capacitors are still connected necessarily. Due to the capacitors, the minimization of the line widths is greatly restricted, which is undesirable to decrease the CDs of the semiconductor devices.

SUMMARY

According to an aspect, the present disclosure provides a method of manufacturing a semiconductor structure, including: providing a semiconductor substrate, a first bit line (BL) being formed in the semiconductor substrate; forming a support layer on the semiconductor substrate, the support layer including a first oxide layer, a first sacrificial layer, a second oxide layer, a second sacrificial layer, a third oxide layer, a third sacrificial layer and a fourth oxide layer that are stacked sequentially on the semiconductor substrate; forming, at a position of the support layer corresponding to the first BL, an active pillar penetrating through the support layer in a vertical direction; removing each of the first sacrificial layer and the third sacrificial layer, and forming a first trench respectively; etching a part of a peripheral wall of the active pillar from each first trench, and forming first annular grooves around the active pillar, and a size of the first annular groove being greater than a size of the first trench in the vertical direction; forming a P-type filler in each of the first annular grooves; forming a semiconductor oxide layer in each P-type filler, where in the vertical direction, a size of the semiconductor oxide layer is not less than the size of the first trench but less than a size of the P-type filler; forming a word line (WL) layer in each first trench; removing the second sacrificial layer, and forming a second trench; and forming a drain connecting layer in the second trench.

According to another aspect, the present disclosure provides a semiconductor structure, which is manufactured with the method in the foregoing any implementation, and includes: a semiconductor substrate, provided with a first BL; a functional layer, provided on the semiconductor substrate, and including a first oxide layer, a WL layer, a second oxide layer, a drain connecting layer, a third oxide layer, a WL layer and a fourth oxide layer that are stacked sequentially; and a semiconductor pillar, provided at a position corresponding to the first BL, and penetrating through the functional layer in a vertical direction, where the semiconductor pillar includes: an active pillar, including two pillar bodies connected integrally in the vertical direction, a junction between the two pillar bodies being located on the drain connecting layer, and two ends of each of the pillar bodies being provided therebetween with a first annular groove around the pillar body; a P-type filler, provided in the first annular groove of each of the pillar bodies; and a semiconductor oxide layer, provided in each P-type filler, and connected to the corresponding WL layer, where in the vertical direction, a size of the semiconductor oxide layer is not less than a size of the corresponding WL layer but less than a size of the corresponding P-type filler.

BRIEF DESCRIPTION OF THE DRAWINGS

The above and other features and advantages of the present disclosure will become more apparent by describing exemplary implementations in detail with reference to the accompanying drawings.

DETAILED DESCRIPTION

Figure 1:
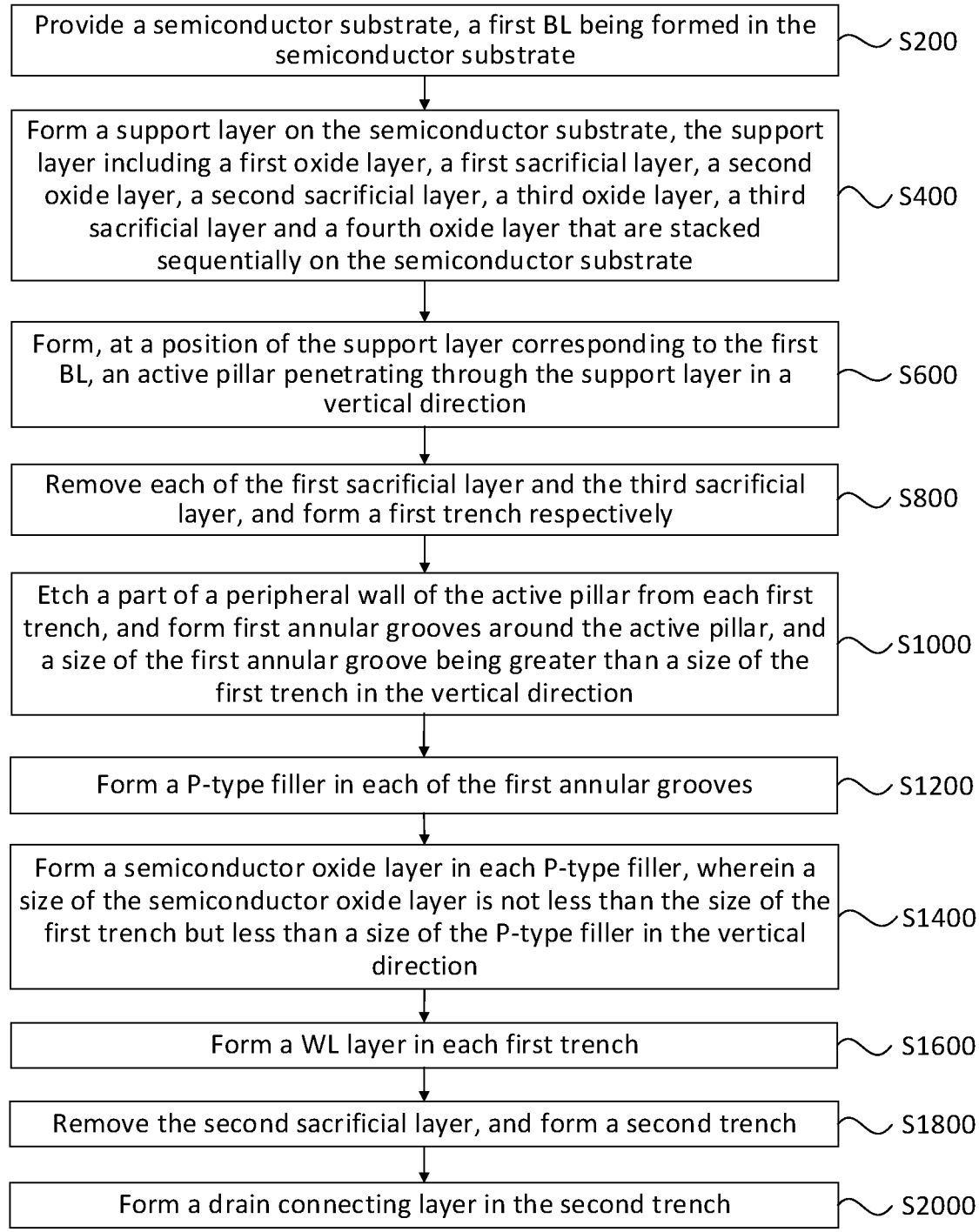
FIG. 1 is a flowchart of a method of manufacturing a semiconductor structure according to an exemplary embodiment of the present disclosure.

The exemplary implementations are described more comprehensively below with reference to the accompanying drawings. However, the exemplary implementations may be implemented in various forms, and may not be construed as being limited to those described herein. On the contrary, these implementations are provided to make the present disclosure comprehensive and complete and to fully convey the concept of the exemplary implementations to those skilled in the art. The same reference numerals in the figures indicate the same or similar structures, and thus their detailed descriptions are omitted.

Different exemplary implementations of the present disclosure are described below with reference to the accompanying drawings. The accompanying drawings form a part of the present disclosure, which show by way of example different exemplary structures that can implement various aspects of the present disclosure. It should be understood that other specific solutions of components, structures, exemplary apparatuses, systems, and steps may be used, and structural and functional modifications may be made without departing from the scope of the present disclosure. Moreover, although the terms such as "above", "between", and "within" may be used in this specification to describe different exemplary features and elements of the present disclosure, these terms are used herein only for convenience of description, for example, according to the directions of the examples in the accompanying drawings. Nothing in this specification should be understood as requiring a specific three-dimensional direction of the structure to fall within the scope of the present disclosure. In addition, the terms "first" and "second" in the claims are used only as markers, not as a limit to the numbers of objects.

The flowcharts shown in the accompanying drawings are only exemplary illustrations, and it is not mandatory to include all contents and operations/steps, or perform the operations/steps in the order described. For example, some operations/steps can also be decomposed, while some operations/steps can be merged or partially merged. Therefore, an actual execution order may change based on an actual situation.

In addition, in the description of the present disclosure, "a plurality of" means at least two, such as two or three, unless otherwise expressly and specifically defined. Technical terms for indicating orientations such as "on" and "under" are merely for a clearer description, rather than a limit.

An embodiment of the present disclosure provides a method of manufacturing a semiconductor structure. As shown in FIG. 1 to FIG. 20, FIG. 1 illustrates a flowchart of a method of manufacturing a semiconductor structure according to an embodiment of the present disclosure. FIG. 2 to FIG. 19C illustrate schematic structural views at different manufacturing stages of a semiconductor structure according to an embodiment of the present disclosure. FIG. 20 illustrates a schematic view of a semiconductor structure according to another embodiment of the present disclosure. As shown in FIG. 1, the method of manufacturing a semiconductor structure in the embodiment includes:

Step S200: Provide a semiconductor substrate 10, a first BL 101 being formed in the semiconductor substrate 10.

Step S400: Form a support layer 20 on the semiconductor substrate 10, the support layer 20 including a first oxide layer 201, a first sacrificial layer 202, a second oxide layer 203, a second sacrificial layer 204, a third oxide layer 205, a third sacrificial layer 206 and a fourth oxide layer 207 that are stacked sequentially on the semiconductor substrate 10.

Step S600: Form, at a position of the support layer 20 corresponding to the first BL 101, an active pillar 30 penetrating through the support layer 20 in a vertical direction Z.

Step S800: Remove each of the first sacrificial layer 202 and the third sacrificial layer 206, and form a first trench 60 respectively.

Step S1000: Etch a part of a peripheral wall of the active pillar 30 from each first trench 60, and form first annular grooves 301 around the active pillar 30, and a size of the first annular groove 301 being greater than a size of the first trench 60 in the vertical direction Z.

Step S1200: Form a P-type filler 40 in each of the first annular grooves 301.

Step S1400: Form a semiconductor oxide layer 50 in each P-type filler 40, where in the vertical direction Z, a size of the semiconductor oxide layer 50 is not less than the size of the first trench 60 but less than a size of the P-type filler 40.

Step S1600: Form a WL layer 70 in each first trench 60.

Step S1800: Remove the second sacrificial layer 204, and form a second trench 80.

Step S2000: Form a drain connecting layer 90 in the second trench 80.

According to the method of manufacturing a semiconductor structure in the present disclosure, the P-type filler 40 is formed in the first annular groove 301 of the active pillar 30. The semiconductor oxide layer 50 is formed between the P-type filler 40 and the WL layer 70. The P-type filler 40 located between the semiconductor oxide layer 50 and the active pillar 30 in the vertical direction Z is formed into the charge storage structure S. Therefore, charges can be stored in the charge storage structure S without the capacitor. In addition, the method implements dual-layered stacking of the charge storage structure S in the vertical direction Z to improve the charge storage density and further decrease the CD of the semiconductor device.

Detailed descriptions will be made below to the method of manufacturing a semiconductor structure in the embodiment of the present disclosure.

Step S200: Provide a semiconductor substrate 10, a first BL 101 being formed in the semiconductor substrate 10.

The semiconductor substrate 10 in the embodiment of the present disclosure may be made of silicon, silicon carbide, silicon nitride, silicon on insulator (SOD, stacked SOI, stacked silicon-germanium on insulator (SGOI), SGOI or germanium on insulator (GOI), and is not specifically defined thereto.

Figure 2:
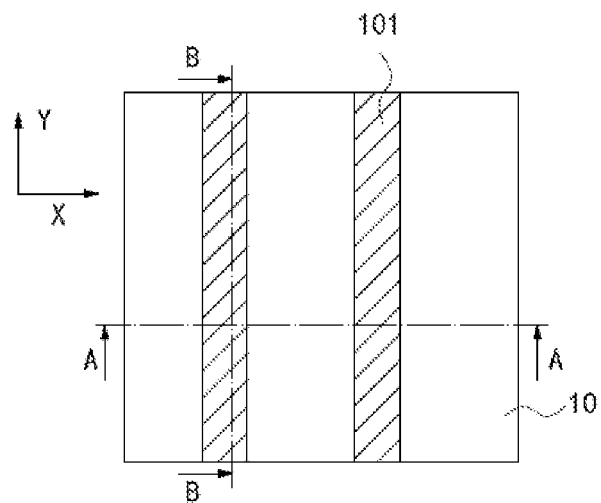
FIG. 2 is a top view of a semiconductor substrate according to an exemplary embodiment of the present disclosure.
Figure 2A:
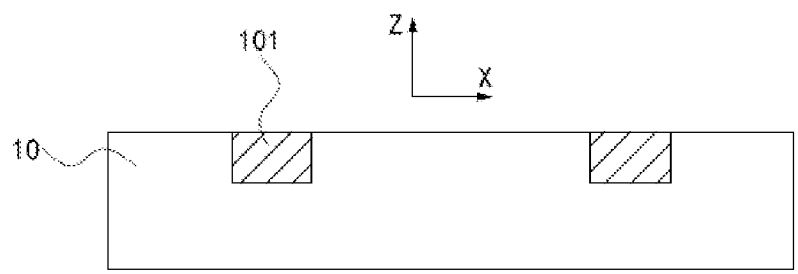
FIG. 2A is a cross-sectional view along A-A in FIG. 2.
Figure 2B:
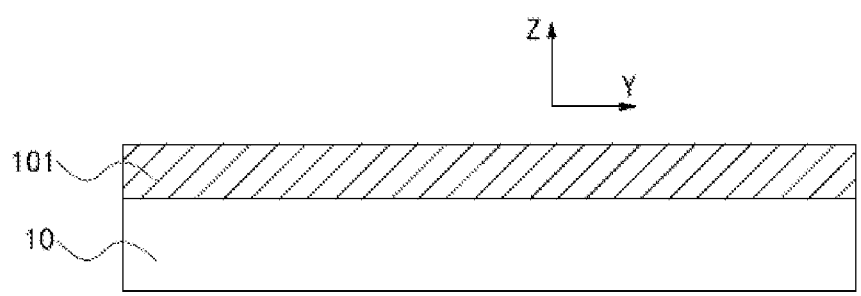
FIG. 2B is a cross-sectional view along B-B in FIG. 2.

As shown in FIG. 2 to FIG. 2B, N-type doping is performed on the semiconductor substrate 10 to form the first BL 101. The first BL 101 may be formed by ion implantation, namely by implanting N-type dopant ions such as P and As into the semiconductor substrate 10. In some embodiments, a number of the first bit lines 101 is plurality, and a plurality of the first BLs 101 may extend along a second horizontal direction Y, which may also be understood as that a plurality of N-type doped regions extending along the second direction are formed in the semiconductor substrate 10.

Step S400: Form a support layer 20 on the semiconductor substrate 10, the support layer 20 including a first oxide layer 201, a first sacrificial layer 202, a second oxide layer 203, a second sacrificial layer 204, a third oxide layer 205, a third sacrificial layer 206 and a fourth oxide layer 207 that are stacked sequentially on the semiconductor substrate 10.

Figure 3:
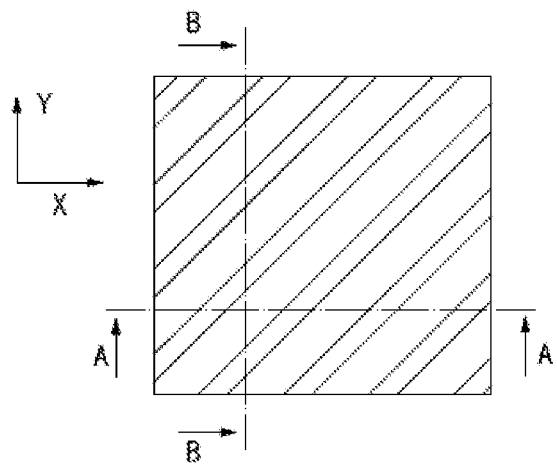
FIG. 3 is a top view of forming a support layer on a semiconductor substrate according to an embodiment of the present disclosure.
Figure 3A:
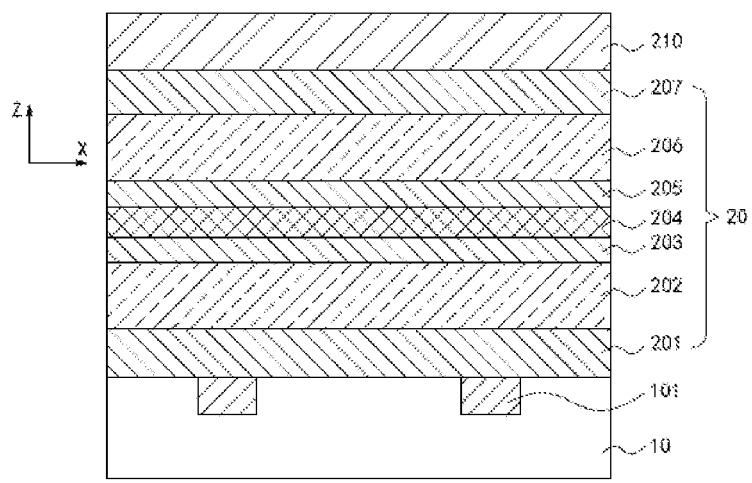
FIG. 3A is a cross-sectional view along A-A in FIG. 3.
Figure 3B:
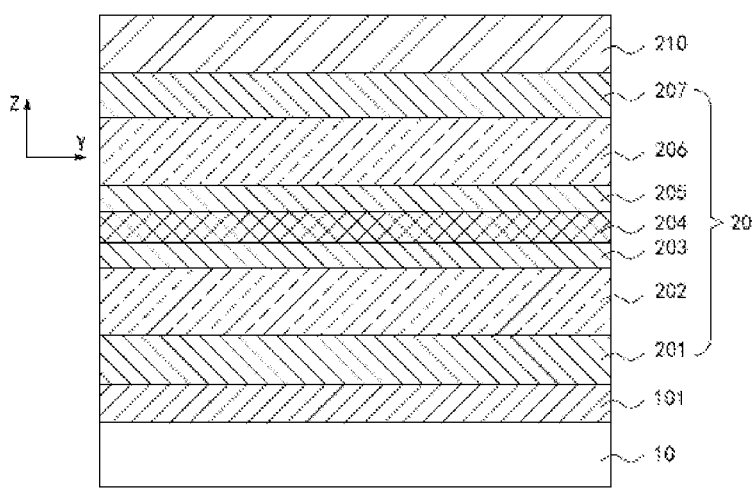
FIG. 3B is a cross-sectional view along B-B in FIG. 3.

As shown in FIG. 3 to FIG. 3B, the first oxide layer 201, the first sacrificial layer 202, the second oxide layer 203, the second sacrificial layer 204, the third oxide layer 205, the third sacrificial layer 206 and the fourth oxide layer 207 are deposited sequentially to form a stacked structure along a vertical direction Z. The first oxide layer 201, the second oxide layer 203, the third oxide layer 205 and the fourth oxide layer 207 are made of a material including at least one of silicon oxide and silicon oxycarbide. The first sacrificial layer 202 and the third sacrificial layer 206 may be made of a material including at least one of silicon nitride and silicon oxynitride, namely the first sacrificial layer 202 and the third sacrificial layer 206 may be made of a same material. The second sacrificial layer 204 may be made of a material including polycrystalline silicon. Considering that the second sacrificial layer 204 is made of a different material from the first sacrificial layer 202 and the third sacrificial layer 206, the second sacrificial layer 204 has a different etch selectivity from the first sacrificial layer 202 and the third sacrificial layer 206, and when the first sacrificial layer 202 and the third sacrificial layer 206 are etched subsequently, there remains the second sacrificial layer 204.

It is to be noted that terms "on" and "under" refer to a relative positional relationship between different components in the semiconductor structure in the embodiment of the present disclosure. For example, as shown in FIG. 3A, if the first oxide layer 201 is located on the semiconductor substrate 10 and the first sacrificial layer 202 is located on the first oxide layer 201, the semiconductor substrate 10 is located under the first oxide layer 201, and the first oxide layer 201 is located under the first sacrificial layer 202. With the stacking direction of the layers in the support layer 20 as the vertical direction Z, the technical terms "on" and "under" may be understood as a relative positional relationship in the vertical direction Z. In addition, the terms "first horizontal direction X" and "second horizontal direction Y" in the embodiment of the present disclosure may be understood as two horizontal directions perpendicular to the vertical direction Z. There is an included angle between the first horizontal direction X and the second horizontal direction Y, namely the two horizontal directions are not parallel to each other. In some embodiments, the first horizontal direction X may be perpendicular to the second horizontal direction Y. The terms indicating the relative positional relationship in the embodiment of the present disclosure are used merely for illustration, rather than limitation.

Step S600: Form, at a position of the support layer 20 corresponding to the first BL 101, an active pillar 30 penetrating through the support layer 20 in a vertical direction Z.

Figure 4:
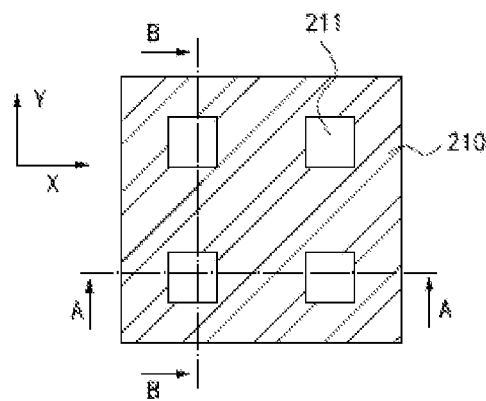
FIG. 4 is a top view of forming a filling hole in a support layer according to an embodiment of the present disclosure.
Figure 4A:
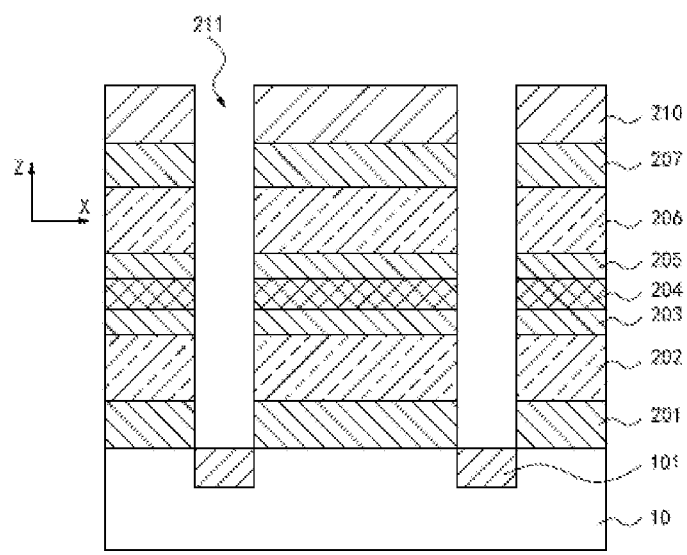
FIG. 4A is a cross-sectional view along A-A in FIG. 4.
Figure 4B:
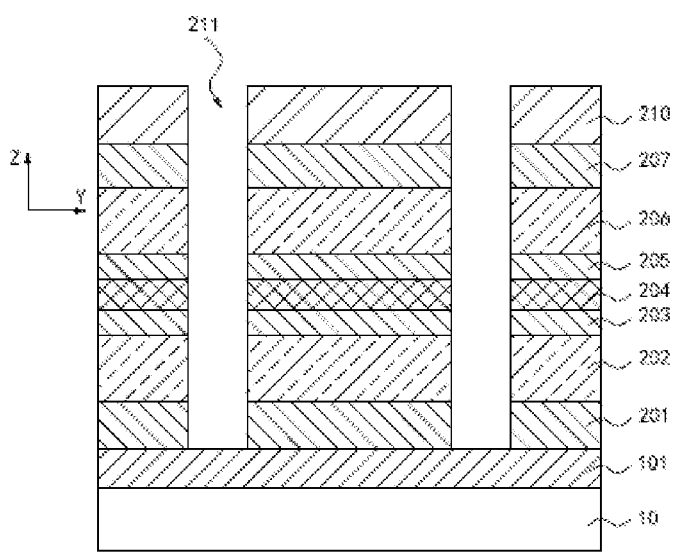
FIG. 4B is a cross-sectional view along B-B in FIG. 4.

Referring also to FIG. 3A and FIG. 3B, a first hard mask layer 210 is formed on the fourth oxide layer 207. As shown in FIG. 4 to FIG. 4B, a mask pattern for a filling hole 211 is formed on the first hard mask layer 210, the mask pattern for the filling hole 211 corresponding to a position of the first BL 101. The support layer 20 is etched according to the mask pattern to form the filling hole 211 penetrating through the support layer 20 in the vertical direction Z, namely the filling hole 211 extends to surface of the first BL 101 from the fourth oxide layer 207 in the vertical direction Z.

Figure 5:
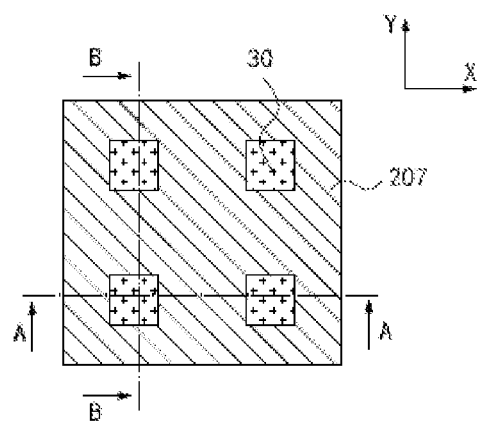
FIG. 5 is a top view of filling an active pillar in a filling hole according to an embodiment of the present disclosure.
Figure 5A:
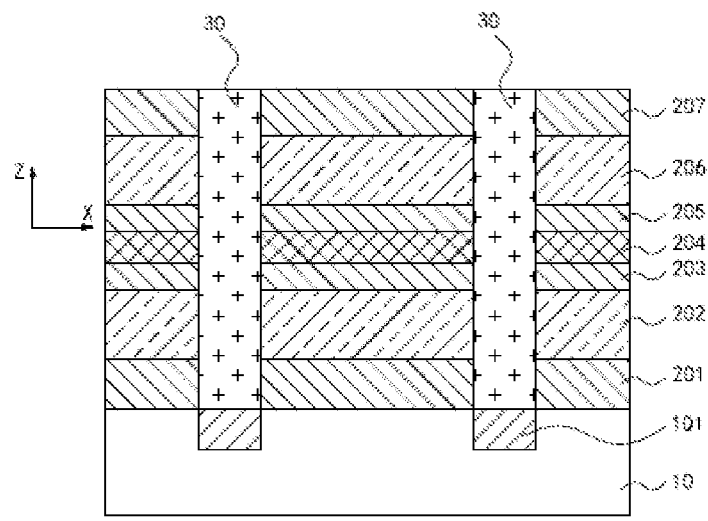
FIG. 5A is a cross-sectional view along A-A in FIG. 5.
Figure 5B:
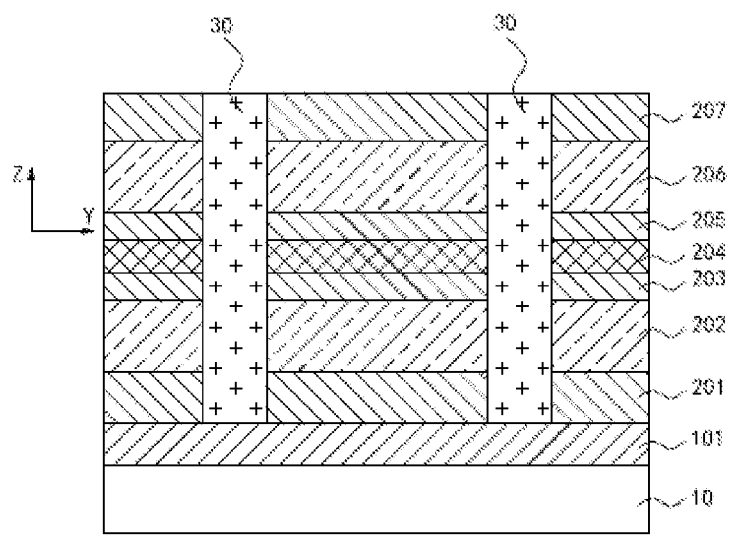
FIG. 5B is a cross-sectional view along B-B in FIG. 5.

As shown in FIG. 5 to FIG. 5B, the first hard mask layer 210 on the fourth oxide layer 207 is removed, and the active pillar 30 is formed in the filling hole 211. Therefore, the active pillar 30 penetrates through the support layer 20 in the vertical direction Z.

In some embodiments, a number of the active pillars 30 is plurality, and a plurality of the active pillars 30 are arranged on the first BLs 101, namely the active pillars are located on the first BLs 101 and electrically connected to the first BLs 101. Therefore, there are a plurality of active pillars 30 on each first BL 101 extending along the second horizontal direction Y, and a plurality of spaced active pillars 30 in the first horizontal direction X. The active pillars 30 are arranged in an array.

In some embodiments, the active pillar 30 is formed by SEG, and the active pillar 30 is formed with an N-type doping material, such as an N-type silicon pillar, namely P or As doped silicon. The active pillar 30 and the first BL 101 may be made of a same material, and certainly may also be made of different materials, which is not specifically defined herein.

Step S800: Remove each of the first sacrificial layer 202 and the third sacrificial layer 206, and form a first trench 60 respectively.

Figure 7A:
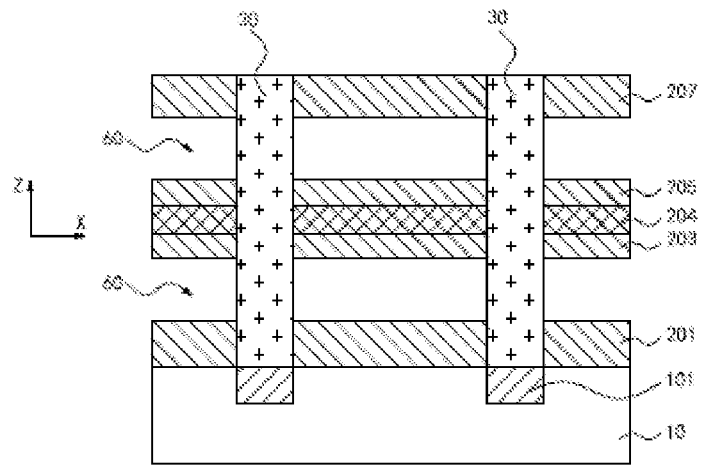
FIG. 7A is a schematic view of removing each of a first sacrificial layer and a third sacrificial layer to form a first trench in a semiconductor structure in FIG. 6A.
Figure 7B:
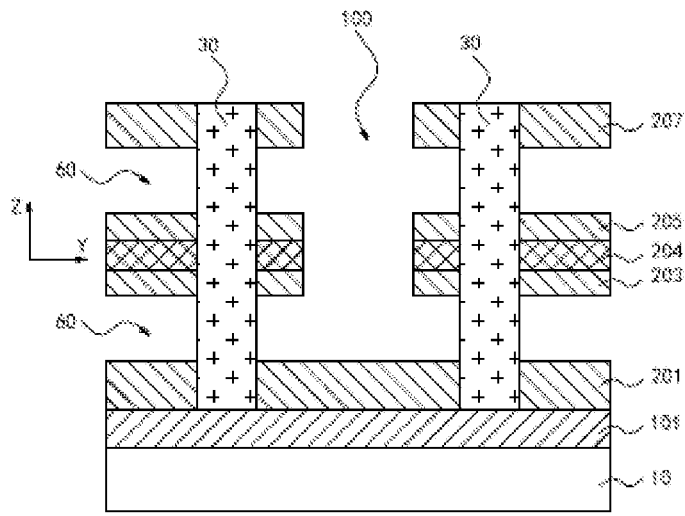
FIG. 7B is a schematic view of removing each of a first sacrificial layer and a third sacrificial layer to form a first trench in a semiconductor structure in FIG. 6B.

As shown in FIG. 7A and FIG. 7B, each of the first sacrificial layer 202 and the third sacrificial layer 206 is etched to form first trenches 60. In some embodiments, the first sacrificial layer 202 and the third sacrificial layer 206 may be removed by wet etching. With concentrated sulfuric acid and hydrogen peroxide as an etchant, the wet etching adjusts a concentration of the etchant to control the extent of etching, thereby controlling the etching accuracy on the first sacrificial layer 202 and the third sacrificial layer 206. Etching parameters may be adjusted by those skilled in the art according to actual conditions, and are not specifically defined herein.

Figure 6:
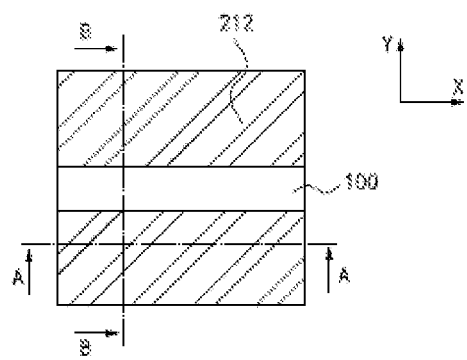
FIG. 6 is a top view of forming an isolation groove in a support layer according to an embodiment of the present disclosure.
Figure 6A:
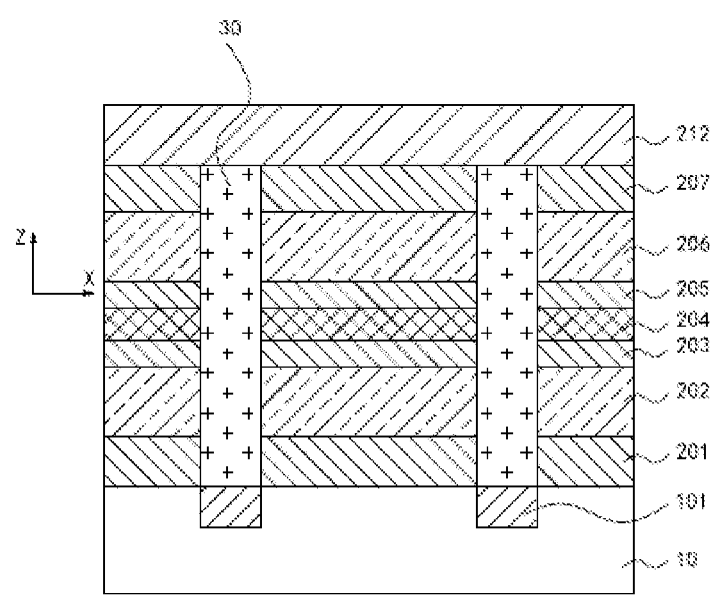
FIG. 6A is a cross-sectional view along A-A in FIG. 6.
Figure 6B:
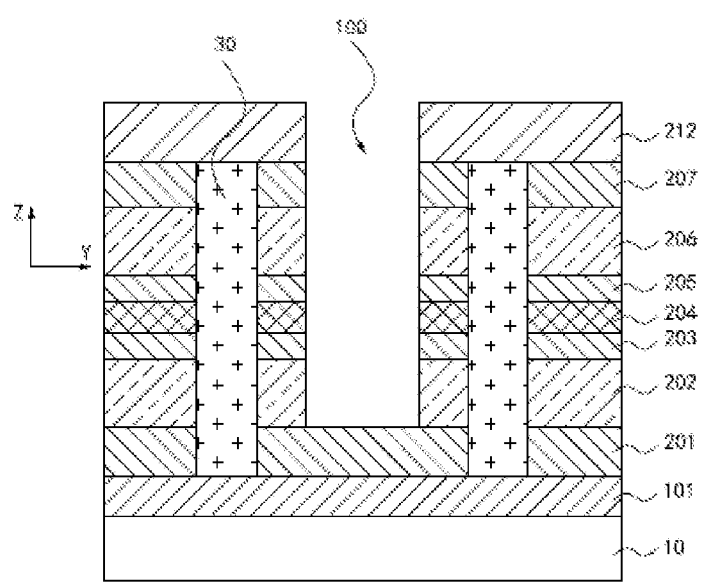
FIG. 6B is a cross-sectional view along B-B in FIG. 6.

Referring to FIG. 6 to FIG. 6B, before Step S800, the method of manufacturing a semiconductor structure in the embodiment of the present disclosure further includes Step S700: Form, in the support layer 20, an isolation groove 100 extending along the first horizontal direction X, the isolation groove 100 extending to a top surface of the first oxide layer 201 from the fourth oxide layer 207, and the isolation groove 100 being located between two adjacent active pillars 30 in the second horizontal direction Y.

Specifically, a second hard mask layer 212 is formed on the fourth oxide layer 207, and a mask pattern for the isolation groove 100 is formed on the second hard mask layer 212. The mask pattern extends along the first horizontal direction X. According to the mask pattern, the support layer 20 is wet-etched from the fourth oxide layer 207 to the top surface of the first oxide layer 201 to form the isolation groove 100. The isolation groove 100 is located between two adjacent active pillars 30 in the second horizontal direction Y.

Step S1000: Etch a part of a peripheral wall of the active pillar 30 from each first trench 60, and form first annular grooves 301 around the active pillar 30, and a size of the first annular groove 301 being greater than a size of the first trench 60 in the vertical direction Z.

Figure 8A:
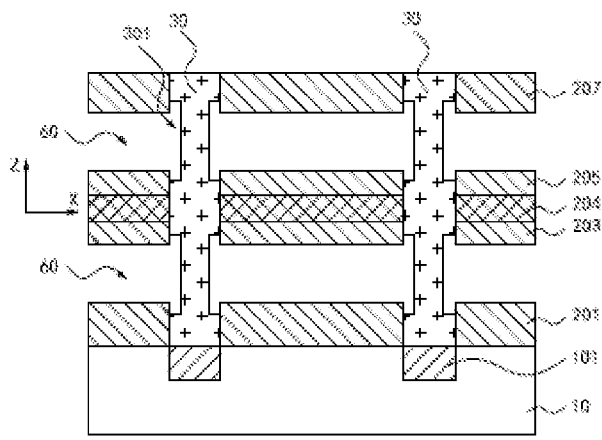
FIG. 8A is a schematic view of forming a first annular groove in a semiconductor structure in FIG. 7A.
Figure 8B:
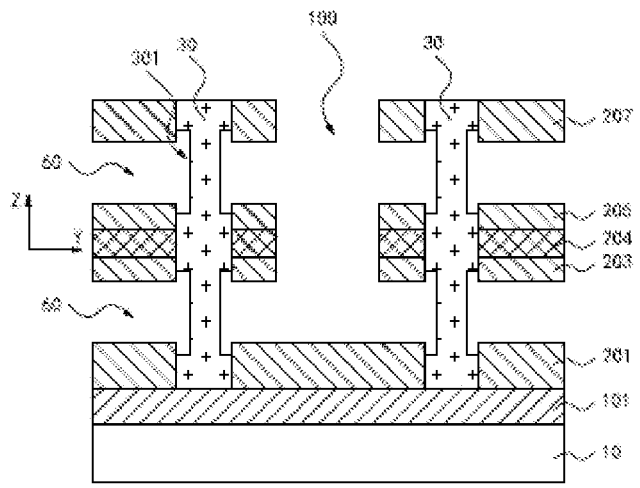
FIG. 8B is a schematic view of forming a first annular groove in a semiconductor structure in FIG. 7B.

As shown in FIG. 8A and FIG. 8B, the peripheral wall of the active pillar 30 exposed is in the first trench 60 is etched, such that a part of the active pillar 30 corresponding to the first trench 60 has a "U-shaped" section along the vertical direction Z. In some embodiments, the peripheral wall exposed in the first trench 60 may be wet-etched, with tetramethyl ammonium hydroxide (TMAH) as an etchant. The etching depth and CD of the first annular groove 301 may be controlled accurately through the amount and concentration of the etchant. The etching process may be selected by those skilled in the art according to actual conditions, and is not specifically defined herein.

In some embodiments, as shown in FIG. 8A and FIG. 8B, each active pillar 30 is provided with two first annular grooves 301. Two ends of the first annular groove 301 close to the semiconductor substrate 10 in the vertical direction Z correspond to the first oxide layer 201 and the second oxide layer 203, while two ends of the first annular groove 301 away from the semiconductor substrate 10 in the vertical direction Z correspond to the third oxide layer 205 and the fourth oxide layer 207.

Step S1200: Form a P-type filler 40 in each of the first annular grooves 301.

Figure 9A:
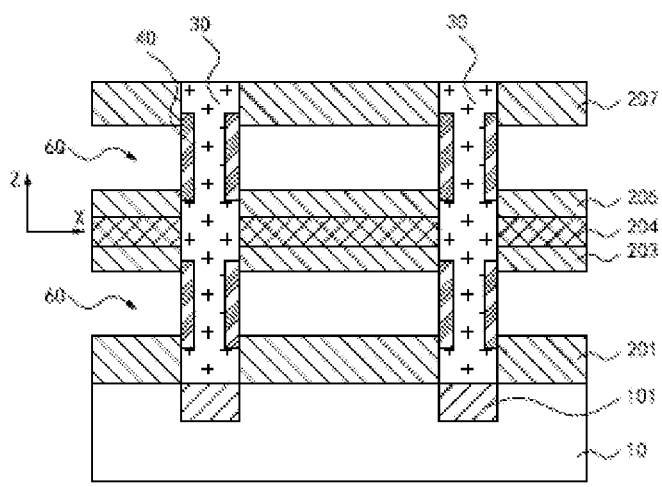
FIG. 9A is a schematic view of forming a P-type filler in a semiconductor structure in FIG. 8A.
Figure 9B:
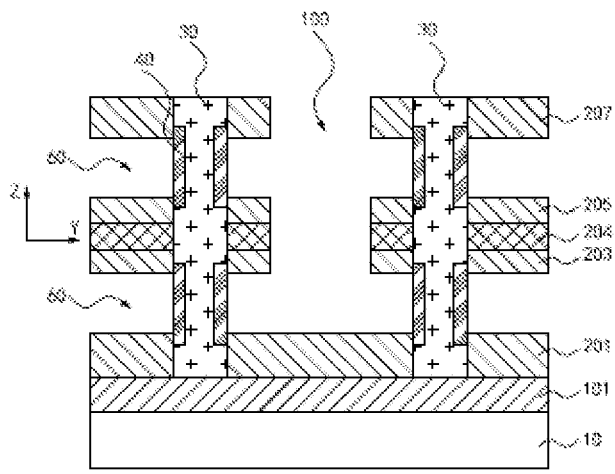
FIG. 9B is a schematic view of forming a P-type filler in a semiconductor structure in FIG. 8B.

As shown in FIG. 9A and FIG. 9B, the two first annular grooves 301 of each active pillar 30 are filled with the P-type filler 40. The P-type filler 40 may be P-type doped silicon, such as a B-doped silicon material. The P-type filler 40 may be formed by the SEG.

Step S1400: Form a semiconductor oxide layer 50 in each P-type filler 40, where in the vertical direction Z, a size of the semiconductor oxide layer 50 is not less than a size of the first trench 60 but less than a size of the P-type filler 40.

Figure 10A:
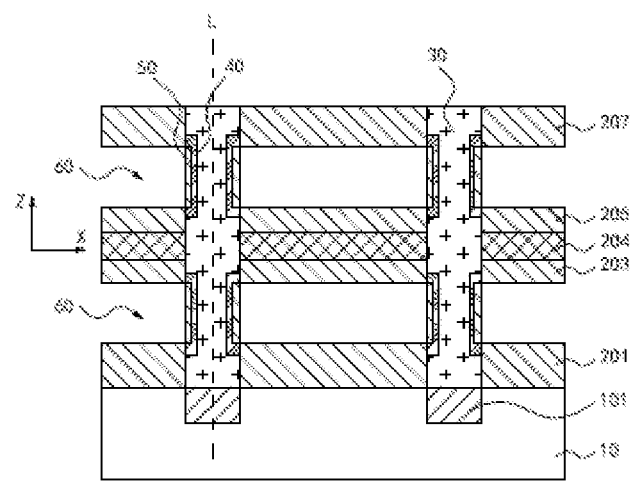
FIG. 10A is a schematic view of forming a semiconductor oxide layer in a semiconductor structure in FIG. 9A.
Figure 10B:
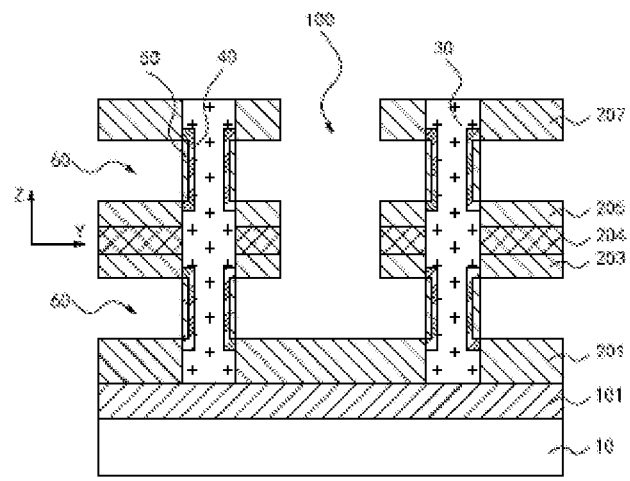
FIG. 10B is a schematic view of forming a semiconductor oxide layer in a semiconductor structure in FIG. 9B.

In some embodiments, as shown in FIG. 10A and FIG. 10B, the forming a semiconductor oxide layer 50 in each P-type filler 40 may include: Oxidize each P-type filler 40 to a predetermined thickness to form the semiconductor oxide layer 50, an orthographic projection of the first trench 60 on the semiconductor oxide layer 50 overlapping completely with the semiconductor oxide layer 50 or falling within the semiconductor oxide layer 50. That is, the semiconductor oxide layer 50 is formed in the P-type filler 40 in situ to achieve more stable bonding between the P-type filler 40 and the semiconductor oxide layer 50.

In some embodiments, the predetermined thickness of the semiconductor oxide layer 50 is less than a thickness of the P-type filler 40. The predetermined thickness refers to the size from a surface of the semiconductor oxide layer 50 close to the first trench 60 to a central axis L of the active pillar 30. That is, there is the P-type filler 40 between the semiconductor oxide layer 50 and the active pillar 30.

In the vertical direction Z, the size of the semiconductor oxide layer 50 may be the same as that of the first trench 60, and may also be greater than that of the first trench 60 and less than that of the P-type filler 40, such that the P-type filler 40 between the semiconductor oxide layer 50 and the active pillar 30 is formed into a charge storage structure S in the vertical direction Z. Certainly, the charge storage structure S is not strictly located between the semiconductor oxide layer 50 and the active pillar 30, and may also extend toward the semiconductor oxide layer 50 by at least a part in the vertical direction Z. The charge storage structure S functions as a capacitor in the conventional semiconductor structure, and can store and release charges. Therefore, the semiconductor structure manufactured with the method may not be provided with the capacitor to further miniaturize the semiconductor device.

In other embodiments, the forming a semiconductor oxide layer 50' in the P-type filler 40 includes: Form the semiconductor oxide layer 50' on a surface of the P-type filler 40 exposed in the first trench 60, the size of the semiconductor oxide layer 50' being the same as that of the first trench 60 in the vertical direction Z.

As shown in FIG. 20, unlike the foregoing embodiment, the semiconductor oxide layer 50' is not oxidized by the P-type filler 40 in situ, but the semiconductor oxide layer 50' is formed by growing an external material on the surface of the P-type filler 40 in the first trench 60. The semiconductor oxide layer 50' may be formed by the SEG. The size of the semiconductor oxide layer 50' in the vertical direction Z is the same as that of the first trench 60 in the vertical direction Z. Therefore, the size of the semiconductor oxide layer 50' can be controlled more accurately.

The P-type filler 40 between the semiconductor oxide layer 50' and the active pillar 30 in the vertical direction Z is also formed into the charge storage structure S. Certainly, the charge storage structure S is not strictly located between the semiconductor oxide layer 50' and the active pillar 30, and may also extend toward the semiconductor oxide layer 50' by at least a part in the vertical direction Z, as shown in FIG. 20. The charge storage structure S has the same function as the foregoing embodiment, which is not repeated herein.

Step S1600: Form a WL layer 70 in each first trench 60.

Figure 11A:
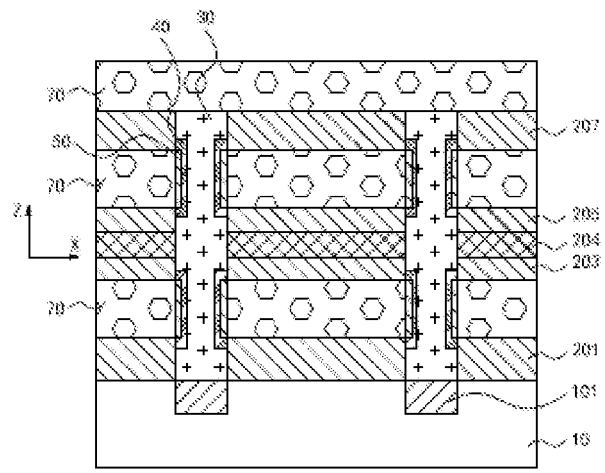
FIG. 11A is a schematic view of forming a WL layer in a semiconductor structure in FIG. 10A.
Figure 11B:
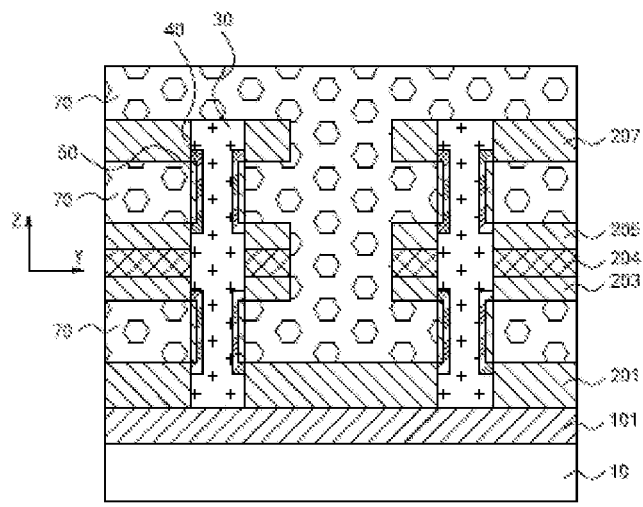
FIG. 11B is a schematic view of forming a WL layer in a semiconductor structure in FIG. 10B.

As shown in FIG. 11A and FIG. 11B, the WL layer 70 is separately deposited in the two first trenches 60. The WL layer 70 is connected to the semiconductor oxide layer 50. The WL layer 70 may be made of a material including at least one of tungsten, tantalum, gold, silver and ruthenium.

Figure 12A:
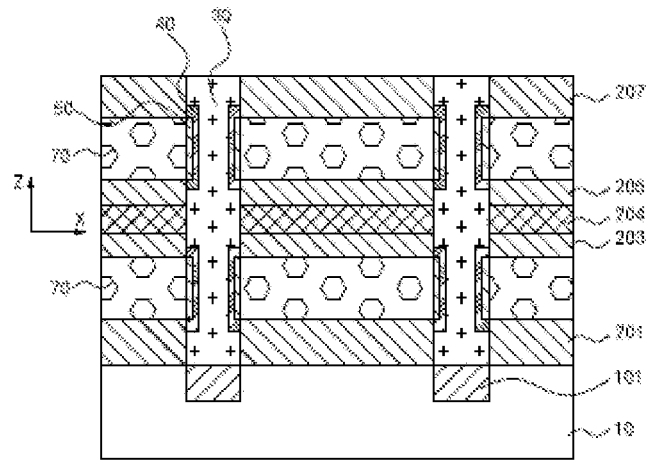
FIG. 12A is a schematic view of removing a WL layer in an isolation groove in a semiconductor structure in FIG. 11A.
Figure 12B:
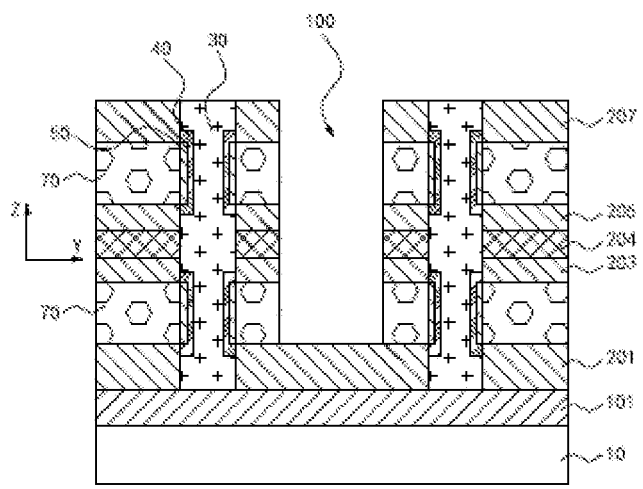
FIG. 12B is a schematic view of removing a WL layer in an isolation groove in a semiconductor structure in FIG. 11B.

Referring to FIG. 11B, owing to the isolation groove 100 formed in Step S700, when the WL layer 70 is deposited, the material of the WL layer 70 is also formed in the isolation groove 100 and on the fourth oxide layer 207. As shown in FIG. 12A and FIG. 12B, upon formation of the WL layer 70, the material of the WL layer 70 on the surface of the fourth oxide layer 207 and the material of the WL layer 70 in the isolation groove 100 are etched.

Step S1800: Remove the second sacrificial layer 204, and form a second trench 80.

Figure 13A:
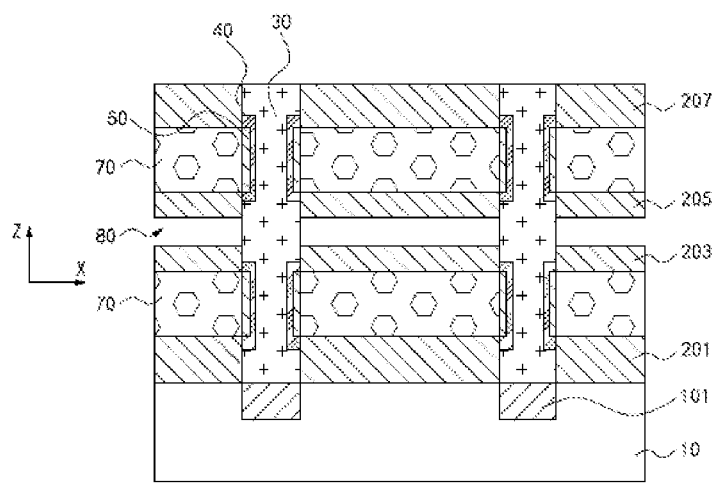
FIG. 13A is a schematic view of removing a second sacrificial layer in a semiconductor structure in FIG. 12A.
Figure 13B:
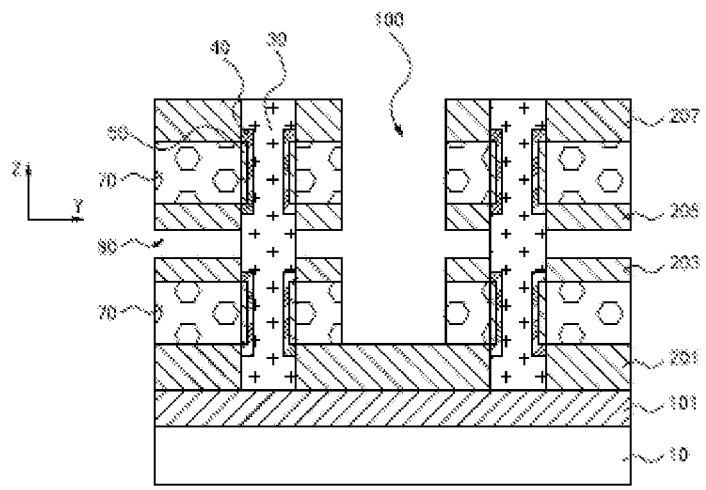
FIG. 13B is a schematic view of removing a second sacrificial layer in a semiconductor structure in FIG. 12B.

As shown in FIG. 13A and FIG. 13B, the second sacrificial layer 204 is etched to expose the active pillar 30 in the second trench 80. The etching process may be the wet etching.

Step S2000: Form a drain connecting layer 90 in the second trench 80.

Figure 14A:
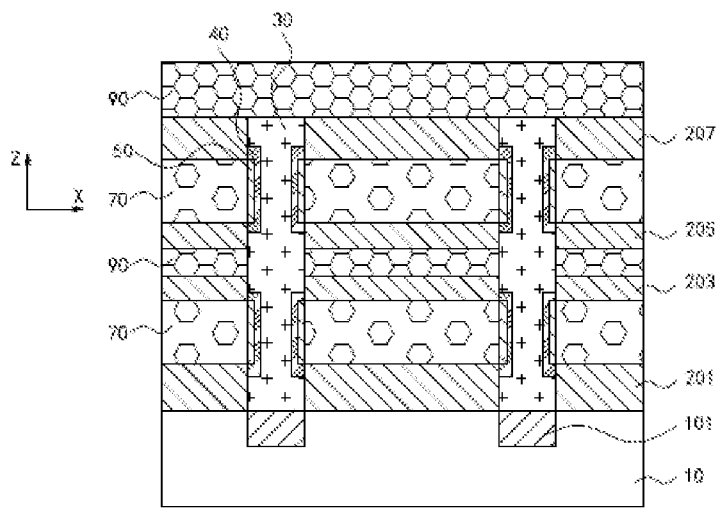
FIG. 14A is a schematic view of forming a drain connecting layer in a semiconductor structure in FIG. 13A.
Figure 14B:
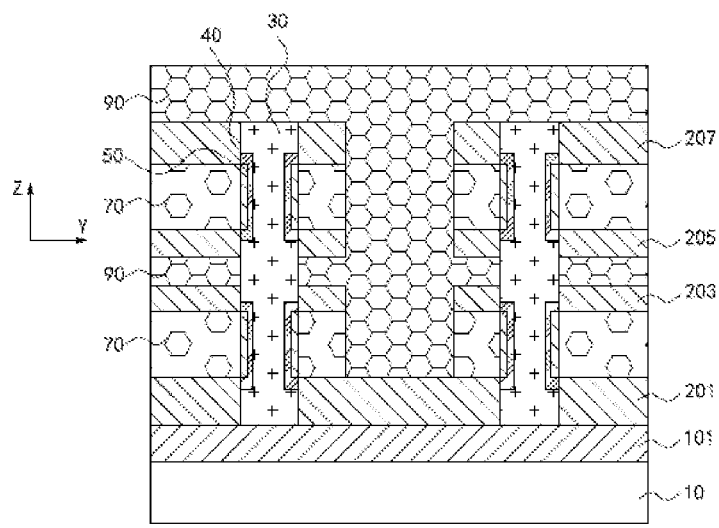
FIG. 14B is a schematic view of forming a drain connecting layer in a semiconductor structure in FIG. 13B.
Figure 15A:
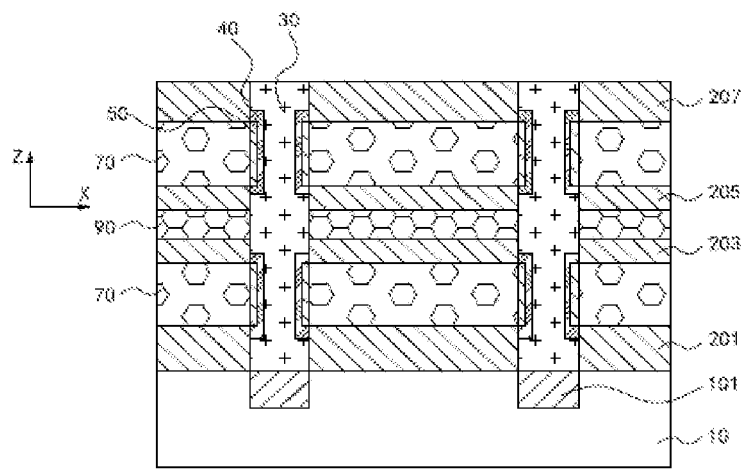
FIG. 15A is a schematic view of removing a drain connecting layer in an isolation groove in FIG. 14A.
Figure 15B:
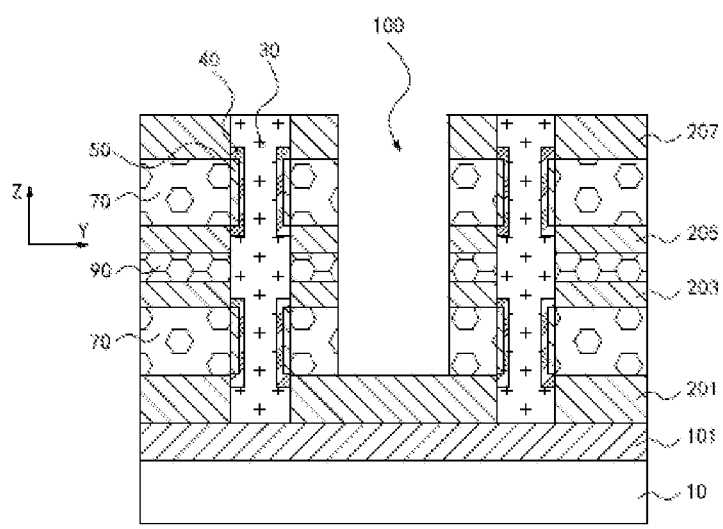
FIG. 15B is a schematic view of removing a drain connecting layer in an isolation groove in FIG. 14B.

As shown in FIG. 14A and FIG. 14B, the drain connecting layer 90 is deposited in the second trench 80. The drain connecting layer 90 is connected to the active pillar 30. The drain connecting layer 90 may be made of a material including at least one of tungsten, tantalum, gold, silver and ruthenium. As shown in FIG. 14B, while the drain connecting layer 90 is formed in the second trench 80, the conductive material of the drain connecting layer 90 is also deposited in the isolation groove 100 and on the fourth oxide layer 207. Therefore, as shown in FIG. 15A and FIG. 15B, upon formation of the drain connecting layer 90, the conductive material of the drain connecting layer 90 in the isolation groove 100 and on the fourth oxide layer 207 is removed.

Step S2200: Form a fifth oxide layer 208 on the fourth oxide layer 207 and a top end of the active pillar 30.

Figure 16A:
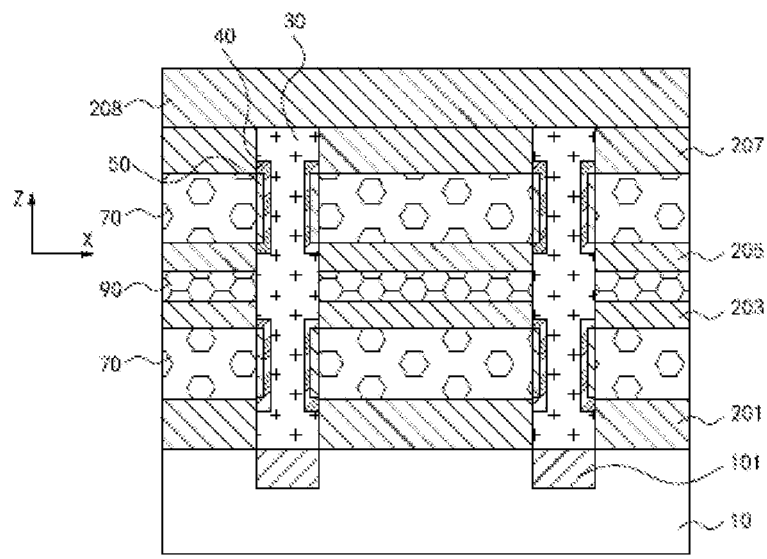
FIG. 16A is a schematic view of forming a fifth oxide layer in a semiconductor structure in FIG. 15A.
Figure 16B:
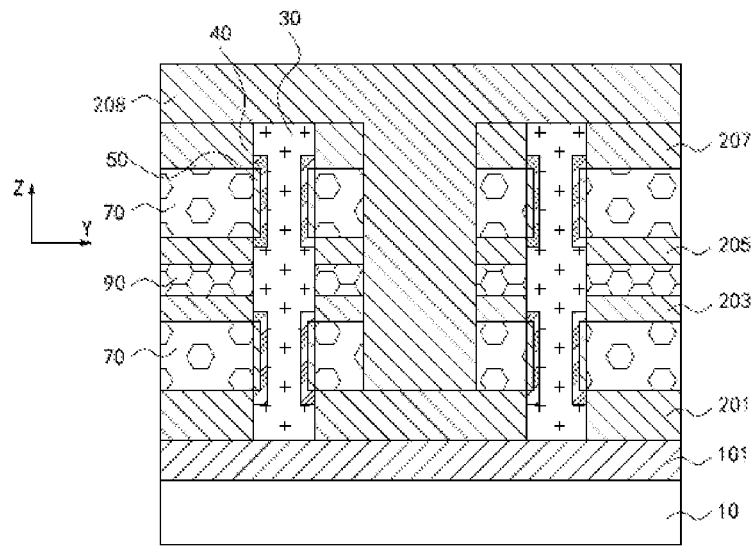
FIG. 16B is a schematic view of forming a fifth oxide layer in a semiconductor structure in FIG. 15B.

As shown in FIG. 16A and FIG. 16B, the fifth oxide layer 208 may be deposited on a top surface of the fourth oxide layer 207. Meanwhile, the material of the fifth oxide layer 208 is also filled in the isolation groove 100. In some embodiments, the fifth oxide layer 208 may be thicker than the fourth oxide layer 207, such that subsequently formed BL contact plug hole 110 is deeper and BL contact plug 120 is more stable, thereby achieving more stable performance of the semiconductor structure. The fifth oxide layer 208 may be made of a material including at least one of silicon oxide and silicon oxycarbide.

Step S2400: Form a dielectric layer 209 on the fifth oxide layer 208.

Figure 17:
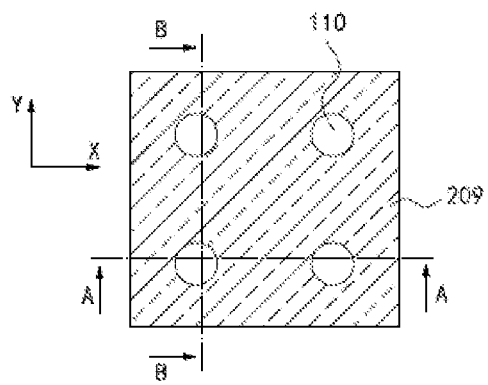
FIG. 17 is a top view of forming a dielectric layer and a BL contact plug hole in a semiconductor structure in FIG. 16A and FIG. 16B.
Figure 17A:
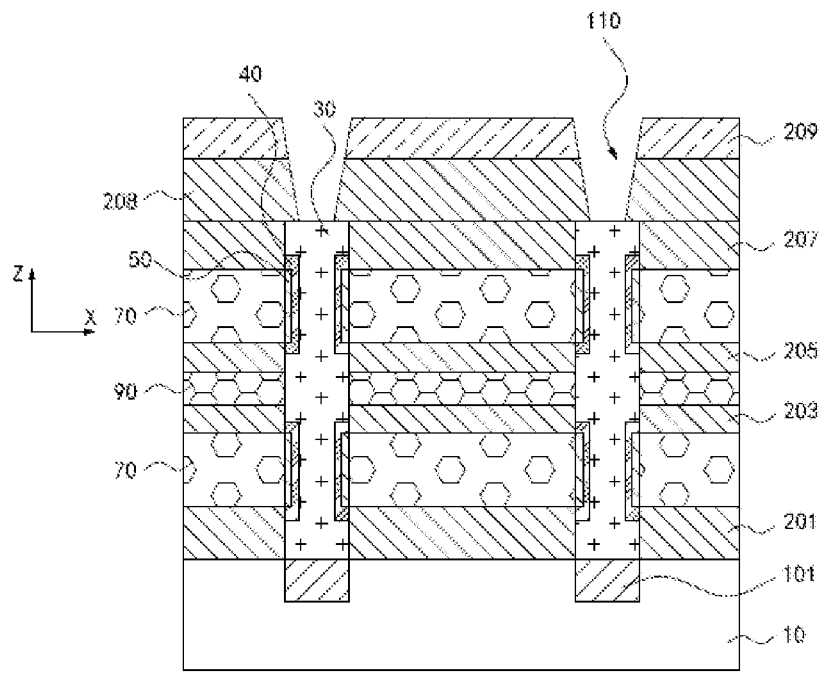
FIG. 17A is a cross-sectional view along A-A in FIG. 17.
Figure 17B:
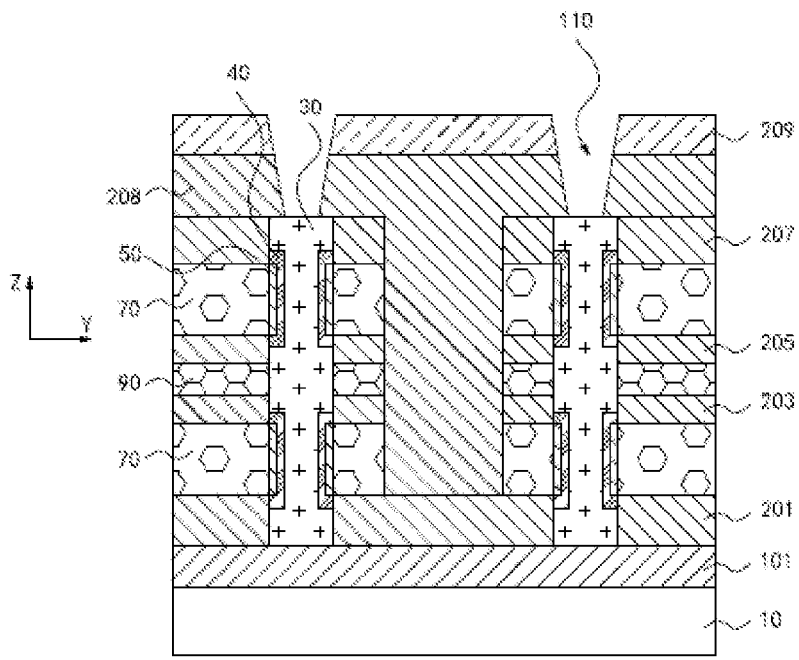
FIG. 17B is a cross-sectional view along B-B in FIG. 17.

As shown in FIG. 17, FIG. 17A and FIG. 17B, the dielectric layer 209 is deposited on the fifth oxide layer 208. The dielectric layer 209 may be made of a material including at least one of silicon nitride and silicon oxynitride.

Step S2600: Form, in the fifth oxide layer 208 and the dielectric layer 209, a BL contact plug hole 110, the bit line contact plug hole 110 contacting with the active pillar 30, and form a BL contact plug 120 in the BL contact plug hole 110.

Figure 18A:
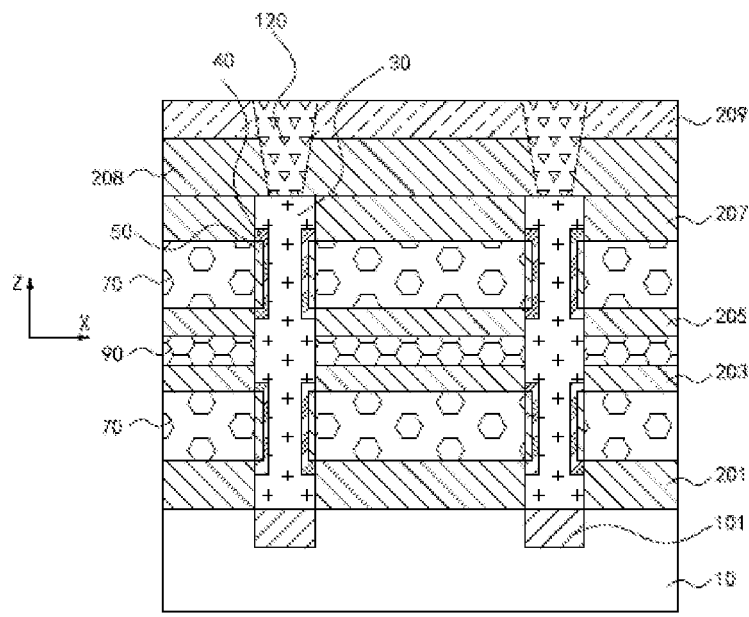
FIG. 18A is a schematic view of forming a BL contact plug in a semiconductor structure in FIG. 17A.
Figure 18B:
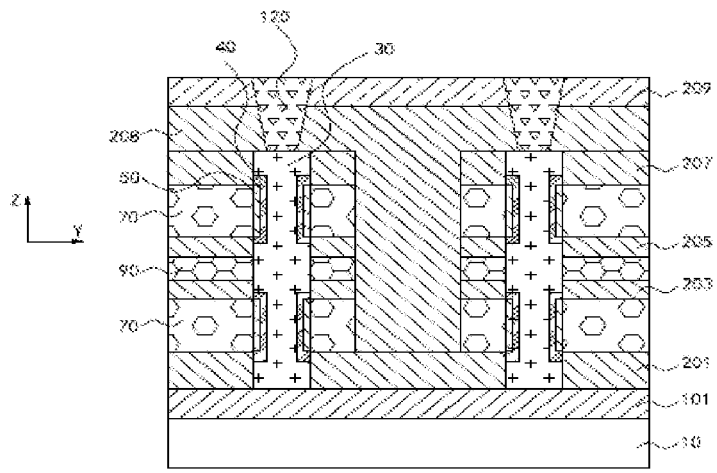
FIG. 18B is a schematic view of forming a BL contact plug in a semiconductor structure in FIG. 17B.

Referring also to FIG. 17 to FIG. 18B, at a position of the dielectric layer 209 corresponding to the active pillar 30, the dielectric layer 209 and the fifth oxide layer 208 are etched to form the BL contact plug hole 110. The BL contact plug 120 is deposited in the BL contact plug hole 110. Thereafter, a surface of the dielectric layer 209 and a surface of the BL contact plug 120 may be planarized by chemical mechanical polishing (CMP). The BL contact plug 120 may be made of a material including at least one of tungsten, tantalum, gold, silver and ruthenium.

Step S2800: Form a second BL 130 on the dielectric layer 209, the second BL 130 being connected to the BL contact plug 120.

Figure 19:
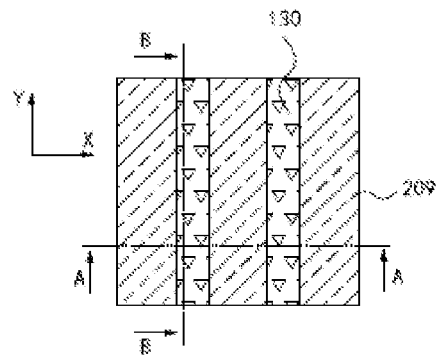
FIG. 19 is a top view of forming a second BL in a semiconductor structure in FIG. 18A and FIG. 18B.
Figure 19A:
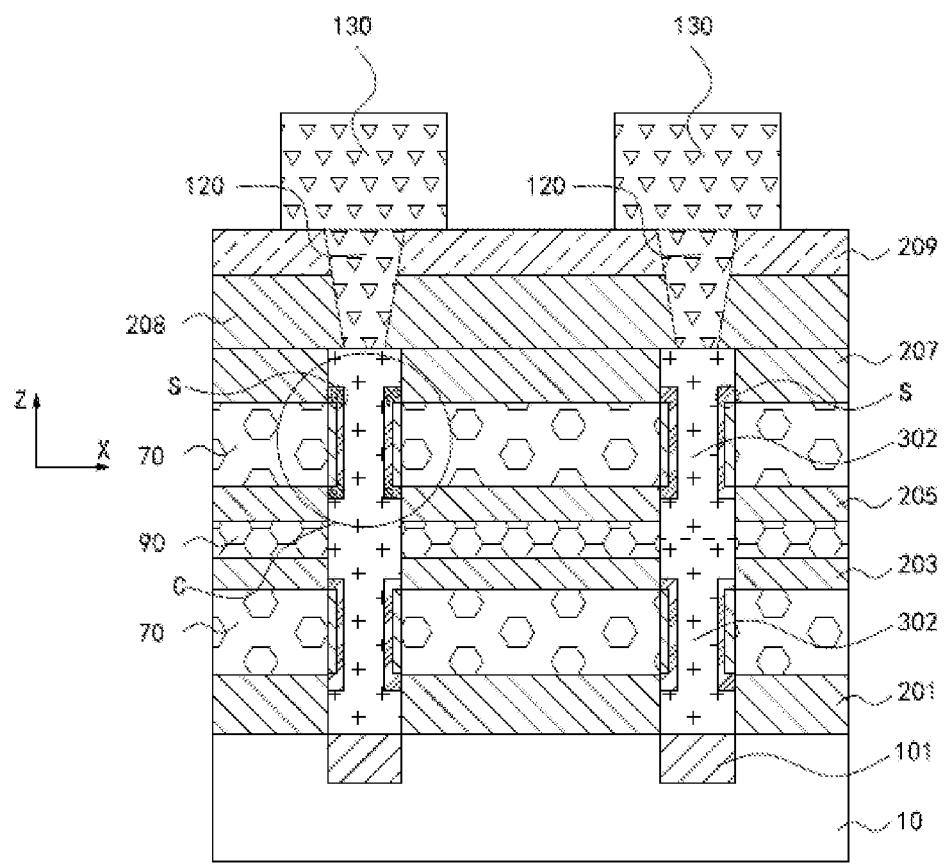
FIG. 19A is a cross-sectional view along A-A in FIG. 19.
Figure 19B:
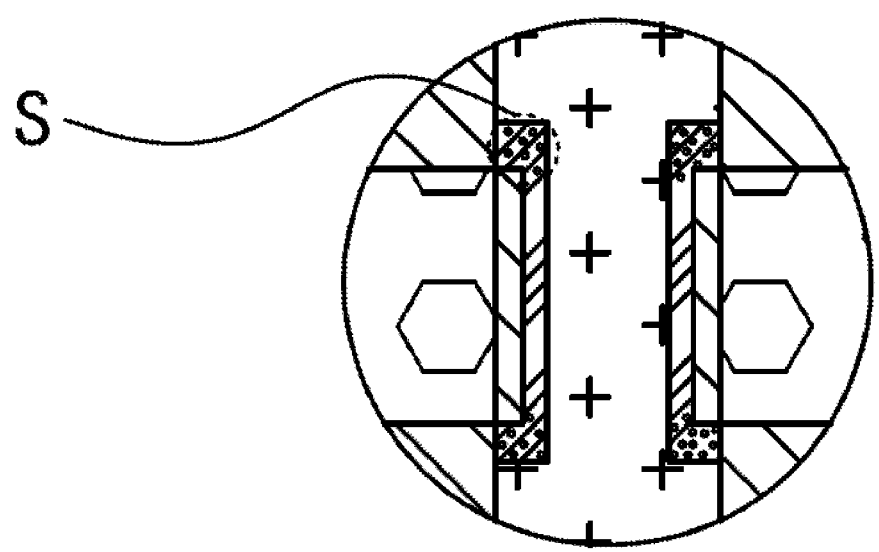
FIG. 19B is an enlarged view at C in FIG. 19A.
Figure 19C:
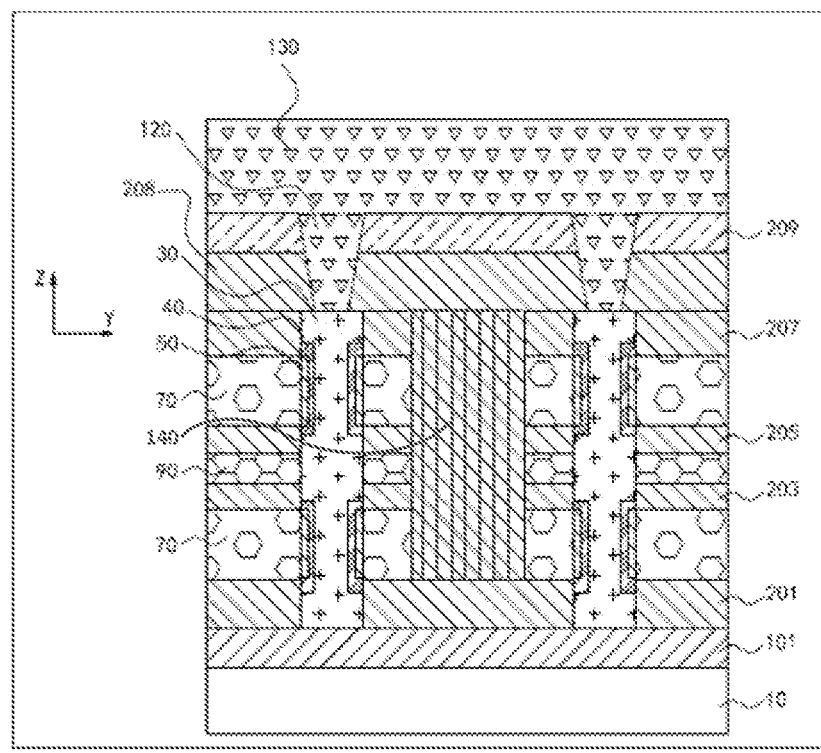
FIG. 19C is a cross-sectional view along B-B in FIG. 19.
Figure 20:
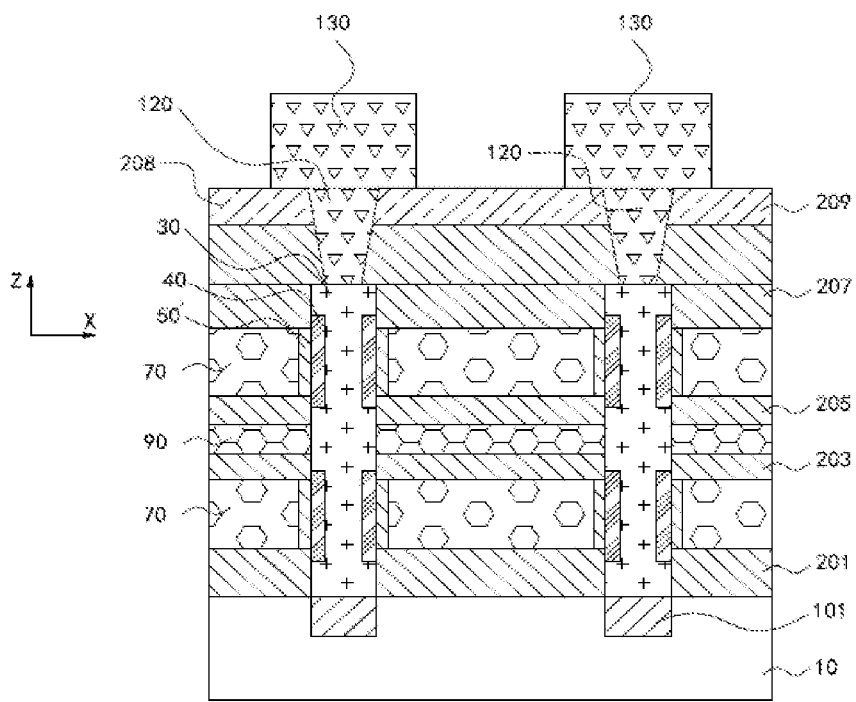
FIG. 20 is a schematic cross-sectional view of a semiconductor structure along a second horizontal direction according to another embodiment.

As shown in FIG. 19 to FIG. 19C, a material of the second BL 130 is deposited on the dielectric layer 209 to form a second BL material layer. An etching process is then employed to remain the second BL material layer connected to the BL contact plug 120, thereby forming the second BL 130. As shown in FIG. 19, an orthographic projection of the second BL 130 on the semiconductor substrate 10 at least partially overlaps with the first BL 101. The orthographic projection of the second BL 130 on the semiconductor substrate 10 overlaps completely with the first BL 101 or the first BL 101 falls within the orthographic projection of the second BL 130 on the semiconductor substrate 10. The second BL 130 extends along the second horizontal direction Y. The second BL 130 are spaced apart along the first horizontal direction X.

According to the method of manufacturing a semiconductor structure in the embodiment of the present disclosure, the P-type filler 40 is formed in the first annular groove 301 of the active pillar 30. The semiconductor oxide layer 50, 50' is formed between the P-type filler 40 and the WL layer 70. The P-type filler 40 located between the semiconductor oxide layer 50 and the active pillar 30 in the vertical direction Z is formed into the charge storage structure S. Therefore, charges can be stored in the charge storage structure S. A part of the active pillar 30 corresponding to the P-type filler 40 is formed into an electric bridge.

When a positive voltage is applied to the WL layer 70 and the drain connecting layer 90, electron-hole pairs are generated in the charge storage structure S of the P-type filler 40. Because of the electric bridge in the active pillar 30, the electrons but not the holes leave away the charge storage structure S. Because of the positive voltage applied to the WL layer 70, a part of the P-type filler 40 close to the semiconductor oxide layer 50 is formed into an inversion layer, and a part of the inversion layer corresponding to the P-type filler 40 is formed into a depletion region, as shown in FIG. 19A. Therefore, there remain the holes in the charge storage structure S to implement the charge storage function. When a positive voltage is applied to the WL layer 70, and a negative voltage is applied to the drain connecting layer 90, the charges in the charge storage structure S are released completely to facilitate next charge storage.

Therefore, the charge storage structure S in the embodiment of the present disclosure functions as the capacitor, and the semiconductor structure manufactured with the method in the embodiment of the present disclosure is unnecessarily provided with the capacitor to miniaturize the size. In addition, the method implements dual-layered stacking of the charge storage structure S in the vertical direction Z to improve the charge storage density and further decrease the CD of the semiconductor device.

According to another aspect, the present disclosure provides a semiconductor structure. The semiconductor structure is manufactured with the method in the foregoing any embodiment. As shown in FIGS. 19A-19C and FIG. 20, the semiconductor structure includes: a semiconductor substrate 10, a functional layer and a semiconductor pillar. The semiconductor substrate 10 is provided with first BLs 101. The functional layer is provided on the semiconductor substrate 10. The functional layer includes a first oxide layer 201, a WL layer 70, a second oxide layer 203, a drain connecting layer 90, a third oxide layer 205, a WL layer 70 and a fourth oxide layer 207 that are stacked sequentially. The semiconductor pillar is provided at a position corresponding to the first BL 101, and penetrates through the functional layer in a vertical direction Z. The semiconductor pillar comprises an active pillar 30, a P-type filler 40 and a semiconductor oxide layer 50.

Materials of the first BL 101, the first oxide layer 201, the WL layer 70, the second oxide layer 203, the drain connecting layer 90, the third oxide layer 205, the fourth oxide layer 207, the active pillar 30, the P-type filler 40 and the semiconductor oxide layer 50 in the embodiment of the present disclosure are the same as those in the method embodiment and are not repeated herein.

In some embodiments, the active pillar 30 includes two pillar bodies 302 connected integrally in the vertical direction Z, a junction between the two pillar bodies 302 is located on the drain connecting layer 90, and two ends of each of the pillar bodies 302 are provided therebetween with a first annular groove 301 around the pillar body 302. The P-type filler 40 is provided in the first annular groove 301 of each of the pillar bodies 302. The semiconductor oxide layer 50 is provided in each P-type filler 40, and connected to the corresponding WL layer 70, where in the vertical direction Z, the size of the semiconductor oxide layer 50 is not less than that of the corresponding WL layer 70 but less than that of the corresponding P-type filler 40.

In some embodiments, as shown in FIG. 19A and FIG. 19B, the semiconductor oxide layer 50 is provided in the P-type filler 40, and an orthographic projection of the WL layer 70 on the semiconductor oxide layer 50 overlaps completely with the corresponding semiconductor oxide layer 50 or falls within the semiconductor oxide layer 50. The P-type filler 40 has a "U-shaped" section in the vertical direction Z. Therefore, the P-type filler 40 between the semiconductor oxide layer 50 and the active pillar 30 is formed into a charge storage structure S in the vertical direction Z.

In other embodiments, as shown in FIG. 20, the semiconductor oxide layer 50 is provided between the corresponding WL layer 70 and the corresponding P-type filler 40, and the size of the semiconductor oxide layer 50 is the same as that of the corresponding WL layer 70 in the vertical direction Z. In the embodiment, the P-type filler 40 between the semiconductor oxide layer 50 and the active pillar 30 is also formed into the charge storage structure S in the vertical direction Z.

The semiconductor structure in the embodiment of the present disclosure further includes: a fifth oxide layer 208, a dielectric layer 209, a BL contact plug 120 and a second BL 130. As shown in FIG. 19A and FIG. 20, the fifth oxide layer 208 is provided on the fourth oxide layer 207. The dielectric layer 209 is provided on the fifth oxide layer 208. The BL contact plug 120 penetrates through the fifth oxide layer 208 and the dielectric layer 209, and is connected to a top end of the active pillar 30. The second BL 130 is provided on the dielectric layer 209, and connected to the BL contact plug 120. As shown in FIG. 19, the orthographic projection of the second BL 130 on the semiconductor substrate 10 overlaps completely with the first BL 101 or the first BL 101 falls within the orthographic projection of the second BL 130 on the semiconductor substrate 10.

In some embodiments, as shown in FIG. 2, a number of the first BLs 101 is plurality, and a plurality of the first BLs 101 are arranged at intervals in the first horizontal direction X, and each of the first BLs 101 extends along a second horizontal direction Y. As shown in FIG. 19A and FIG. 19B, a number of the semiconductor pillars is plurality and a plurality of the semiconductor pillars are arranged on the first BLs 101. The first horizontal direction X is not parallel to the second horizontal direction Y.

In some embodiments, as shown in FIG. 19A and FIG. 19C, the functional layer further includes an isolation layer 140, the isolation layer 140 extending along the first horizontal direction X. The isolation layer 140 extends to a top surface of the first oxide layer 201 from the fourth oxide layer 207, and the isolation layer 140 is located between two adjacent active pillars in the second horizontal direction Y to isolate adjacent semiconductor pillars in the second horizontal direction Y.

According to the semiconductor structure in the embodiment of the present disclosure, owing to the charge storage structure S, charges can be stored in the charge storage structure S. As the charge storage structure S functions as a capacitor, the semiconductor structure in the embodiment of the present disclosure is unnecessarily provided with the capacitor to miniaturize the size. In addition, the semiconductor structure in the embodiment of the present disclosure implements dual-layered stacking of the charge storage structure S in the vertical direction Z to improve the charge storage density and further decrease the CD of the semiconductor device.

It should be understood that the present disclosure does not limit its application to the detailed structure and arrangement of components set forth in this specification. The present disclosure can have other implementations and can be implemented and executed in various ways. Variations and modifications of the foregoing fall within the scope of the present disclosure. It will be understood that the disclosure disclosed and defined in this specification extends to all alternative combinations of two or more individual features mentioned or apparent in the text and/or drawings. All of these different combinations constitute various alternative aspects of the present disclosure. The implementations of this specification illustrate the best mode known for implementing the present disclosure, and will enable any person skilled in the art to make use of the present disclosure.

The invention claimed is:

1. A method of manufacturing a semiconductor structure, comprising:
   providing a semiconductor substrate, a first bit line being formed in the semiconductor substrate;
   forming a support layer on the semiconductor substrate, the support layer comprising a first oxide layer, a first sacrificial layer, a second oxide layer, a second sacrificial layer, a third oxide layer, a third sacrificial layer and a fourth oxide layer that are stacked sequentially on the semiconductor substrate;
   forming, at a position of the support layer corresponding to the first bit line, an active pillar penetrating through the support layer in a vertical direction;
   removing each of the first sacrificial layer and the third sacrificial layer, and forming a first trench respectively;
   etching a part of a peripheral wall of the active pillar from each first trench, and forming first annular grooves around the active pillar, and a size of the first annular groove being greater than a size of the first trench in the vertical direction;
   forming a P-type filler in each of the first annular grooves;
   forming a semiconductor oxide layer in each P-type filler, wherein in the vertical direction, a size of the semiconductor oxide layer is not less than the size of the first trench but less than a size of the P-type filler;
   forming a word line layer in each first trench;
   removing the second sacrificial layer, and forming a second trench; and
   forming a drain connecting layer in the second trench.

2. The method according to claim 1, further comprising:
   forming a fifth oxide layer on the fourth oxide layer and a top end of the active pillar;
   forming a dielectric layer on the fifth oxide layer;
   forming, in the fifth oxide layer and the dielectric layer, a bit line contact plug hole, the bit line contact plug hole contacting with the active pillar, and forming a bit line contact plug in the bit line contact plug hole; and forming a second bit line on the dielectric layer, the second bit line being connected to the bit line contact plug.

3. The method according to claim 2, wherein a number of the first bit lines is plurality, and a plurality of the first bit lines are arranged at intervals in a first horizontal direction, and each of the first bit lines extends along a second horizontal direction; and a number of the active pillars is plurality and a plurality of the active pillars are arranged on the first bit lines; and the first horizontal direction is not parallel to the second horizontal direction.

4. The method according to claim 3, before formation of the first trench, further comprising:

forming, in the support layer, an isolation groove extending along the first horizontal direction, the isolation groove extending to a top surface of the first oxide layer from the fourth oxide layer, and the isolation groove being located between two adjacent active pillars in the second horizontal direction.

5. The method according to claim 4, wherein while the word line layer is formed in each first trench, a material of the word line layer is also formed in the isolation groove, and the material of the word line layer in the isolation groove is then removed.

6. The method according to claim 5, wherein while the drain connecting layer is formed in the second trench, a material of the drain connecting layer is also formed in the isolation groove, and the material of the drain connecting layer in the isolation groove is then removed.

7. The method according to claim 6, wherein the fifth oxide layer is further filled in the isolation groove.

8. The method according to claim 2, wherein the first oxide layer, the second oxide layer, the third oxide layer, the fourth oxide layer and the fifth oxide layer are made of a material comprising at least one of silicon oxide and silicon oxycarbide.

9. The method according to claim 1, wherein the forming a semiconductor oxide layer in each P-type filler comprises:

oxidizing each P-type filler to a predetermined thickness, and forming the semiconductor oxide layer, an orthographic projection of the first trench on the semiconductor oxide layer overlapping completely with the semiconductor oxide layer or falling within the semiconductor oxide layer.

10. The method according to claim 9, wherein the predetermined thickness is less than a thickness of the P-type filler.

11. The method according to claim 1, wherein the forming a semiconductor oxide layer in each P-type filler comprises:

forming the semiconductor oxide layer on a surface of the P-type filler exposed in the first annular groove, the size of the semiconductor oxide layer being the same as the size of the first trench in the vertical direction.

12. The method according to claim 1, wherein the active pillar is an N-type silicon pillar, and the P-type filler is P-type doped silicon.

13. The method according to claim 1, wherein the word line layer and the drain connecting layer are made of a material comprising at least one of tungsten, tantalum, gold, silver and ruthenium.

14. The method according to claim 1, wherein the active pillar and the P-type filler are formed by selective epitaxial growth.

15. A semiconductor structure, manufactured with the method according to claim 1, and comprising:

a semiconductor substrate, provided with a first bit line;

a functional layer, provided on the semiconductor substrate, and comprising a first oxide layer, a word line layer, a second oxide layer, a drain connecting layer, a third oxide layer, a word line layer and a fourth oxide layer that are stacked sequentially; and a semiconductor pillar, provided at a position corresponding to the first bit line, and penetrating through the functional layer in a vertical direction, wherein the semiconductor pillar comprises:

an active pillar, comprising two pillar bodies connected integrally in the vertical direction, a junction between the two pillar bodies being located on the drain connecting layer, and two ends of each of the pillar bodies being provided therebetween with a first annular groove around the pillar body;

a P-type filler, provided in the first annular groove of each of the pillar bodies; and a semiconductor oxide layer, provided in each P-type filler, and connected to the corresponding word line layer, wherein in the vertical direction, a size of the semiconductor oxide layer is not less than a size of the corresponding word line layer but less than a size of the corresponding P-type filler.

16. The semiconductor structure according to claim 15, wherein each semiconductor oxide layer is provided in one P-type filler, and an orthographic projection of each word line layer on the semiconductor oxide layer overlaps completely with the corresponding semiconductor oxide layer or falls within the corresponding semiconductor oxide layer.

17. The semiconductor structure according to claim 15, wherein each semiconductor oxide layer is provided between the corresponding word line layer and the corresponding P-type filler, and the size of the semiconductor oxide layer is the same as the size of the corresponding word line layer in the vertical direction.

18. The semiconductor structure according to claim 15, further comprising:

a fifth oxide layer, provided on the fourth oxide layer;

a dielectric layer, provided on the fifth oxide layer;

a bit line contact plug, penetrating through the fifth oxide layer and the dielectric layer, and connected to a top end of the active pillar; and a second bit line, provided on the dielectric layer, and connected to the bit line contact plug.

19. The semiconductor structure according to claim 18, wherein a number of the first bit lines is plurality, and a plurality of the first bit lines are arranged at intervals in a first horizontal direction, and each of the first bit lines extends along a second horizontal direction; and a number of the semiconductor pillars is plurality and a plurality of the semiconductor pillars are arranged on the first bit lines; and the first horizontal direction is not parallel to the second horizontal direction.

20. The semiconductor structure according to claim 19, wherein the functional layer further comprises an isolation layer extending along the first horizontal direction, the isolation layer extending to a top surface of the first oxide layer from the fourth oxide layer, and the isolation layer being located between two adjacent semiconductor pillars in the second horizontal direction.

* * * * *